(12) United States Patent
Ye

(10) Patent No.: US 11,695,015 B2
(45) Date of Patent: Jul. 4, 2023

(54) ARRAY SUBSTRATE, METHOD OF MANUFACTURING THE SAME, AND DISPLAY PANEL

(71) Applicant: WUHAN CHINA STAR OPTOELECTRONICS SEMICONDUCTOR DISPLAY TECHNOLOGY CO., LTD., Wuhan (CN)

(72) Inventor: Jian Ye, Wuhan (CN)

( * ) Notice: Subject to any disclaimer, the term of this patent is extended or adjusted under 35 U.S.C. 154(b) by 218 days.

(21) Appl. No.: 15/733,903

(22) PCT Filed: Jun. 24, 2020

(86) PCT No.: PCT/CN2020/098180
§ 371 (c)(1),
(2) Date: Dec. 1, 2020

(87) PCT Pub. No.: WO2021/237856
PCT Pub. Date: Dec. 2, 2021

(65) Prior Publication Data
US 2021/0375948 A1    Dec. 2, 2021

(30) Foreign Application Priority Data
May 27, 2020    (CN) .......................... 202010459651.2

(51) Int. Cl.
*H01L 27/12* (2006.01)
*H10K 50/844* (2023.01)
*H10K 59/65* (2023.01)
*H10K 59/88* (2023.01)
*H10K 71/10* (2023.01)
*H10K 71/20* (2023.01)
*H10K 71/00* (2023.01)

(52) U.S. Cl.
CPC ...... *H01L 27/1218* (2013.01); *H01L 27/1262* (2013.01)

(58) Field of Classification Search
CPC .................. H01L 27/1218; H01L 27/1262
See application file for complete search history.

(56) References Cited

U.S. PATENT DOCUMENTS

| | | | |
|---|---|---|---|
| 2018/0097198 A1* | 4/2018 | Chou | H01L 51/5253 |
| 2018/0253175 A1* | 9/2018 | Yao | G06F 3/04166 |
| 2018/0267649 A1* | 9/2018 | Ye | H01L 51/5253 |

(Continued)

FOREIGN PATENT DOCUMENTS

| | | |
|---|---|---|
| CN | 107195794 A | 9/2017 |
| CN | 207134376 U | 3/2018 |
| CN | 109103234 A | 12/2018 |

(Continued)

*Primary Examiner* — Mohsen Ahmadi

(57) ABSTRACT

An array substrate, a display panel, and a display device are disclosed. The array substrate includes a substrate and an array functional layer. The array substrate is provided with a through hole area including a through hole, a buffer area provided around the through hole area, and a display area provided around the buffer area. The buffer area includes part of the substrate and an inorganic film layer provided by the array functional layer. At least a groove is formed in the inorganic film layer around the through hole area, and the groove has a closed ring shape or a non-closed ring shape.

8 Claims, 6 Drawing Sheets

(56) References Cited

U.S. PATENT DOCUMENTS

2019/0157355 A1* 5/2019 Ye .................. H01L 27/3248
2021/0397320 A1* 12/2021 Ye .................... G06F 3/0448

FOREIGN PATENT DOCUMENTS

| CN | 110010665 A | 7/2019 |
| CN | 110416435 A | 11/2019 |
| CN | 111081748 A | 4/2020 |
| JP | S63308944 A | 12/1988 |

* cited by examiner

ARRAY SUBSTRATE, METHOD OF MANUFACTURING THE SAME, AND DISPLAY PANEL

BACKGROUND OF INVENTION

1. Field of Invention

The present invention relates to a technical field of displays, and particularly to, an array substrate, a method of manufacturing the same, and a display panel.

2. Related Art

With increasing development of display technologies, users have begun to have more diverse needs for display effects. For example, there is a keen demand for excellent visual experience brought by high screen aspect ratios of display devices. In current mainstream display devices, in order to place front cameras, shapes of display screens are often designed as a special-shaped screen, such as a "notch" or "drip-liked screen" design.

In order to further increase screen aspect ratios, major manufacturers have begun to develop solutions for in-plane hole designs in display screens. That is to say, only lens-sized circular through holes are only opened in areas directly above displays corresponding to front-facing cameras to achieve ultimate screen aspect ratios. However, in such a solution, the circular through holes opened on surfaces of display panels are likely to result in risks, such as cracks or poor encapsulation at edges of local areas, thereby rendering display panels ineffective. Therefore, how to ensure encapsulation reliability in the local areas and to reduce probability of forming cracks has become an urgent problem to be solved in realization of in-plane hole opening technologies of display panels.

SUMMARY OF INVENTION

An object of the present invention is to provide an array substrate and a method of manufacturing the array substrate. The array substrate is configured with an encapsulation structure capable of effectively reducing a risk of forming cracks in encapsulation layers, thereby avoiding a problem of causing the display panel to be ineffective due to poor encapsulation in an in-plane hole area.

In order to achieve the above-mentioned object, in one aspect, the present invention provides an array substrate, comprising a substrate and an array functional layer disposed on the substrate; wherein the array substrate is provided with a through hole area comprising a through hole, a buffer area provided around the through hole area, and a display area provided around the buffer area; wherein the buffer area comprises part of the substrate and an inorganic film layer provided by the array functional layer disposed on the substrate; wherein at least a groove is formed in the inorganic film layer around the through hole area, the groove has a closed ring shape or a non-closed ring shape, and the groove has a depth less than a thickness of the inorganic film layer and is configured to expose the substrate.

In an array substrate provided by an embodiment of the present invention, a block wall is disposed on the inorganic film layer in the buffer area and surrounds the through hole area, a first buffer area is defined between the block wall and the though hole area, a second buffer area is defined between the block wall and the display area, and the at least a groove is formed in the first buffer area, and/or in the second buffer area, wherein the groove comprises a first groove provided in the first buffer area, and/or a second groove provided in the second buffer area.

In an array substrate provided by an embodiment of the present invention, each of the first groove and the second groove has the closed ring shape or the non-closed ring shape.

In an array substrate provided by an embodiment of the present invention, an organic material is disposed in the first groove.

In an array substrate provided by an embodiment of the present invention, at least one the first groove is provided in the first buffer area, and the inorganic film layer comprises at least two ring-shaped inorganic strip portions defined and spaced apart by the first groove in the first buffer area, wherein when the first groove is annularly closed in shape, at least one of the two ring-shaped inorganic strip portions has one or more gaps, and an organic material is disposed in the one or more gaps.

In an array substrate provided by an embodiment of the present invention, at least two the first grooves are provided in the first buffer area, and the inorganic film layer comprises at least three ring-shaped inorganic strip portions defined and spaced apart by the two first grooves in the first buffer area, wherein each of the outermost and innermost ring-shaped inorganic strip portions is annularly closed in shape, and the remaining ring-shaped inorganic strip portion has a gap.

In an array substrate provided by an embodiment of the present invention, adjacent two of the ring-shaped inorganic strip portions are provided with the gaps located at an angle greater than or equal to 90 degrees and less than or equal to 180 degrees with respect to a center of the through hole area.

In an array substrate provided by an embodiment of the present invention, at least one the second groove is provided in the second buffer area, and the second groove has the non-closed ring shape and one or more interval portions.

In an array substrate provided by an embodiment of the present invention, two the second grooves are provided in the second buffer area, and each of the two second grooves has the non-closed ring shape and is provided with four the interval portions evenly distributed, wherein the interval portions of the two second grooves are staggered with each other by 45 degrees.

In an array substrate provided by an embodiment of the present invention, the second groove is provided in the second buffer area, and the second groove has the non-closed ring shape and is provided with four the interval portions evenly distributed.

In another aspect, the present invention further presents a method of manufacturing an array substrate, the array substrate comprising a through hole area, a buffer area provided around the through hole area, and a display area provided around the buffer area, the method comprising following steps: S01: providing a substrate, forming an array functional layer on the substrate, wherein the through area and the buffer area comprise film layers comprising only an inorganic film layer disposed in the array functional layer and a block wall disposed on the inorganic film layer in the buffer area and surrounding the through hole area; S02: forming at least a groove in the inorganic film layer around the through hole area, wherein the groove has a closed ring shape or a non-closed ring shape, and the groove has a depth less than a thickness of the inorganic film layer and is configured to expose the substrate; S03: filling an organic material in the groove; and S04: forming, by cutting the through hole area, a through hole.

In a method of manufacturing the array substrate provided by an embodiment of the present invention, in step S02, the groove is formed by a dry etching process.

In a method of manufacturing the array substrate provided by an embodiment of the present invention, in step S03, the organic material is filled by an inkjet printing process or a coating process.

In a method of manufacturing the array substrate provided by an embodiment of the present invention, in step S04, the through hole is formed by a laser cutting process.

In a method of manufacturing the array substrate provided by an embodiment of the present invention, the block wall divides the buffer area into a first buffer area formed between the block wall and the though hole area, and a second buffer area formed between the block wall and the display area, wherein the groove so formed comprises a first groove formed in the first buffer area, and/or a second groove formed in the second buffer area.

In a method of manufacturing the array substrate provided by an embodiment of the present invention, each of the first groove and the second groove has the closed ring shape or the non-closed ring shape.

In another aspect, the present invention further provides a display panel comprising the above-mentioned array substrate.

The present invention has advantageous effects as follows: in comparison with prior art, the present invention provides an array substrate and a method of manufacturing the array substrate, and a display panel. By forming a groove in an inorganic film layer in a buffer area provided between a through hole for accommodating a front-facing camera and a display area in the array substrate, the internal stress of the inorganic film layer in the buffer area can be effectively released, thereby significantly reducing a risk of forming cracks on the inorganic film layer in the buffer area, and improving encapsulation reliability of a display panel being prepared.

BRIEF DESCRIPTION OF DRAWINGS

To better illustrate embodiments or technical solutions in the prior art, a brief description of the drawings used in the embodiments or the prior art description will be given below. Obviously, the accompanying drawings in the following description merely show some embodiments of the present invention, and a person skilled in the art may still derive other drawings from these accompanying drawings without creative efforts.

DESCRIPTION OF PREFERRED EMBODIMENTS

Figure 1:
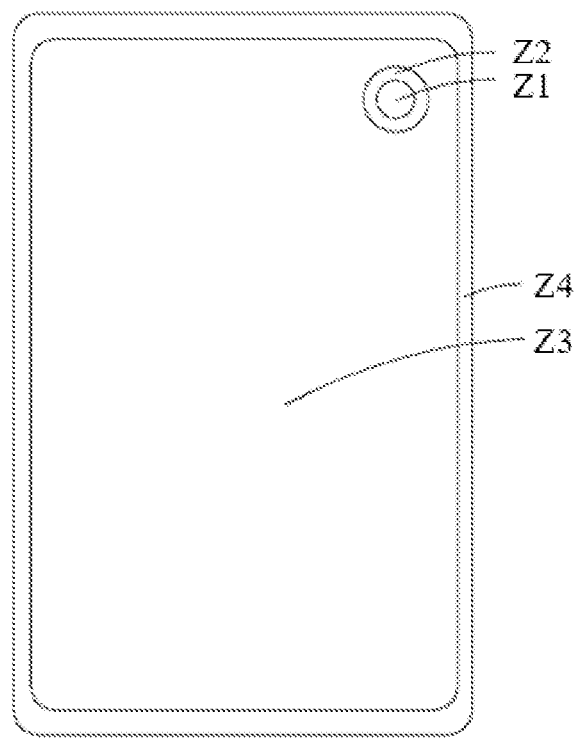
FIG. 1 is a schematic structural plan view of an array substrate in accordance with an embodiment of the present invention.

The technical solutions in the embodiments of the present invention will be clearly and completely described below in conjunction with the accompanying drawings in the embodiments of the present invention. Obviously, the described embodiments are only a part of the embodiments of the present invention, rather than all the embodiments. Based on the embodiments of the present invention, all other embodiments obtained by those skilled in the art without creative work shall fall within the protection scope of the present invention.

In the description of the present invention, it is to be understood that the term "center", "longitudinal", "lateral", "length", "width", "thickness", "upper", "lower", "front", "rear", "left", "right", "vertical", "horizontal", "top", "bottom", "inner", "outer", "clockwise", "counterclockwise" and the like indicates orientation or the orientation or positional relationship based on the positional relationship shown in the drawings, for convenience of description only and the present invention is to simplify the description, but does not indicate or imply that the device or element referred to must have a particular orientation in a particular orientation construction and operation, and therefore not be construed as limiting the present invention. Moreover, the terms "first" and "second" and the like are used for descriptive purposes only and are not to be construed as indicating or implying relative importance. Thus, features defining "first" or "second" may include one or more of the described features either explicitly or implicitly. In the description of the present invention, the meaning of "a plurality" is two or more unless specifically defined otherwise.

In this application, the word "exemplary" is used to mean "serving as an example, illustration, or illustration." Any embodiment described as "exemplary" in this application is not necessarily construed as being more preferred or advantageous over other embodiments. In order to enable any person skilled in the art to implement and use the present invention, the following description is given. In the following description, the details are listed for the purpose of explanation. It should be understood that those of ordinary skill in the art can realize that the present invention can also be implemented without using these specific details. In other instances, well-known structures and processes will not be elaborated to avoid unnecessary details to obscure the description of the present invention. Therefore, the present invention is not intended to be limited to the illustrated embodiments, but is consistent with the widest scope that conforms to the principles and features disclosed in this application.

Figure 2:
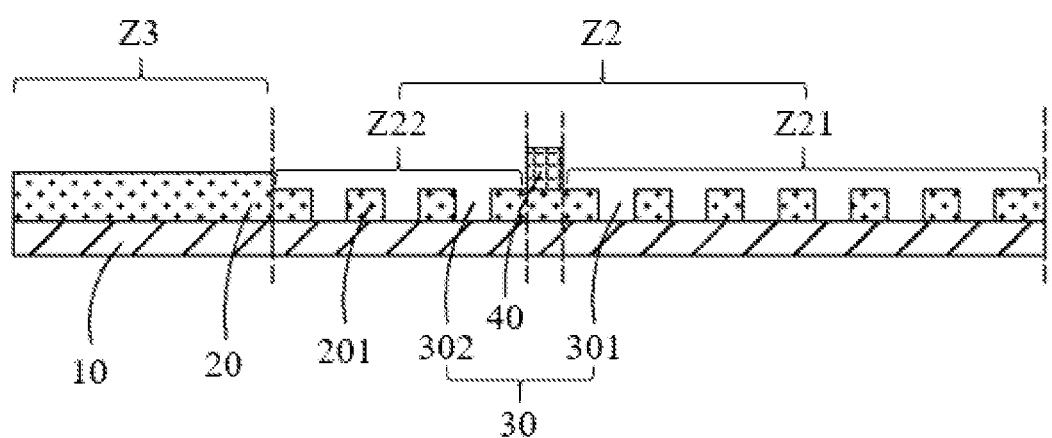
FIG. 2 is a schematic cross-sectional view of an array substrate in accordance with an embodiment of the present invention.

An embodiment of the present invention provides an array substrate. Please refer to FIG. 1 showing a schematic structural plan view of the array substrate, and FIG. 2 showing a schematic cross-sectional view of the array substrate. Specifically, the array substrate includes a substrate 10 and an array functional layer 20 disposed on the substrate 10. The array substrate 10 is divided into a through hole area Z1 provided with a through hole functioning as an area for accommodating a front-facing camera. A buffer area Z2 is formed around the through hole area Z1 and is arranged to separate a display area from the through hole area for playing a major role of providing encapsulation for the display area inside a device. A display area Z3 is formed around the buffer area Z2. A non-display area Z4 is provided on a lateral side or more than two lateral sides of the display area Z3. For example, the non-display area Z4 can be arranged outside four sides of the display area Z3, that is, arranged around the display area Z3.

The buffer area Z2 includes part of the substrate 10 and an inorganic film layer 201 provided by the array functional layer 20 and disposed on the substrate 10 (the inorganic film layer generally is a conventional inorganic film layer in the array functional layer 20, such as a buffer layer, a gate insulating layer, an interlayer dielectric layer, and a passivation layer). At least a groove 30 is formed in the inorganic film layer 201 around the through hole area Z1. The groove 30 has a closed ring shape or a non-closed ring shape, and the groove 30 has a depth (not shown) less than a thickness of the inorganic film layer 201 or is configured to expose the substrate 10.

Since the inorganic film layer 201 is generally under relatively large stress, cracks are easy to appear, which causes moisture and oxygen from the outside to intrude into the display area, making an organic light-emitting diode (OLED) device disposed on the array substrate fail. By providing the groove in the inorganic film layer in the buffer area, stress relieve effects can be achieved by the embodiment of the present application, thereby reducing a risk of forming cracks in the inorganic film layer in the buffer area. There are many options for the depth of the groove, one of which can be less than a thickness of the inorganic film layer, or greater than or equal to the thickness of the inorganic film layer. That is, the substrate is exposed by the groove. When a plurality of the grooves are provided, some of the grooves may have a depth less than that of the inorganic film layer, and others of the grooves expose the substrate, and the grooves may vary according to specific needs. It should be noted that when the inorganic film layer in the groove is completely removed, the stress of the inorganic film layer can be released to the greatest extent.

In this embodiment, the groove 30 is generally formed by a dry etching process. When the groove 30 is configured to expose the substrate 10, a small portion of the substrate under the groove 30 is generally over-etched (not shown) to completely etch and remove the inorganic film layer in the groove 30.

In one embodiment, please continue referring to FIG. 2. A block wall 40 is disposed on the inorganic film layer 201 in the buffer area Z2 and surrounds the through hole area Z1 for preventing a liquid organic material for ink printing form overflowing in a subsequent thin-film encapsulation process. A first buffer area Z21 is defined between the block wall 40 and the though hole area Z1, a second buffer area Z22 is defined between the block wall 40 and the display area Z3, and the groove 30 is formed in the first buffer area Z21, and/or in the second buffer area Z22, that is, the groove 30 is formed only in the first buffer area Z21 or the second buffer area Z22, or formed in both the first buffer area Z21 and the second buffer area Z22. Specifically, the groove 30 provided in the first buffer area Z21 is defined as a first groove 301, and the groove 30 provided in the second buffer area Z22 is defined as a second groove 302.

Figure 3:
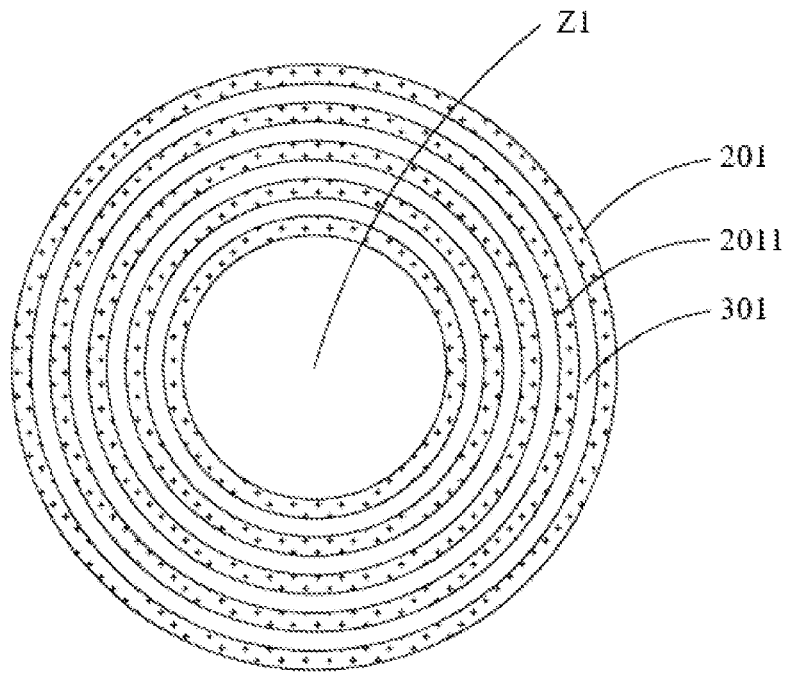
FIG. 3 is a schematic structural plan view of a first buffer area of an array substrate in accordance with an embodiment of the present invention.

In one embodiment, at least one the first groove 301 is formed in the first buffer area z21, wherein the first groove 301 is annularly closed in shape. Please refer to FIG. 3 showing a schematic structural plan view of the first buffer area Z21, wherein there are four first grooves 301 illustrated. The inorganic film layer 201 in the first buffer area Z21 is divided to form five ring-shaped inorganic strip portions 2011 isolated from one another. An organic material (not shown) is filled in the first groove 301. Since the organic material has less stress, a risk of forming cracks in film layers in the first buffer area Z21 can be reduced.

However, when the ring-shaped inorganic strip portions 2011 are annularly closed in shape, relatively large stress still exists. In addition, cracks are likely to occur in the ring-shaped inorganic strip portions having a closed shape, thereby creating a path for intrusion of the moisture, rendering an OLED device disposed on the array substrate failed, and giving rise to poor performance. As a result, in order to reduce stress on the inorganic film layer 201 in the first buffer area Z21, at least a gap 303 is formed in at least one the of the ring-shaped inorganic strip portions 2011. The gap 303 is filled by an organic material. By forming one or more gaps 303 in the ring-shaped inorganic strip portion 2011, the stress on the ring-shaped inorganic strip portions 2011 can be further relieved. That is, a risk of causing encapsulation of the array substrate to be failed due to cracks occurred in the inorganic film layers can be reduced to the greatest extent.

Figure 4:
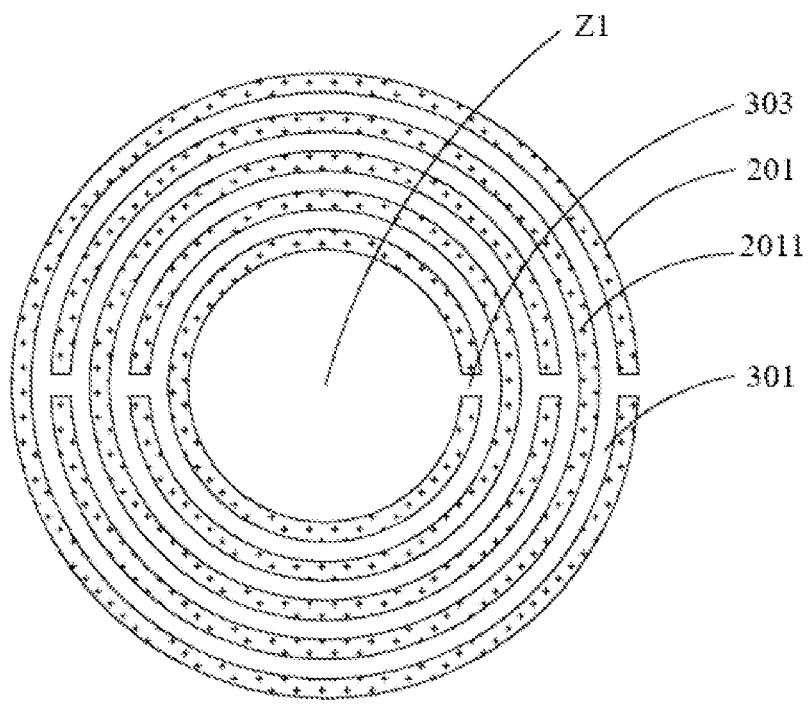
FIG. 4 is a schematic structural plan view of a first buffer area of an array substrate in accordance with another embodiment of the present invention.

Please refer to FIG. 4 showing a schematic structural plan view of the first buffer area Z21. FIG. 4 illustrates each of the ring-shaped inorganic strip portions 2011 is provided with a gap 303. Certainly, there may be only some of the ring-shaped inorganic strip portions 2011 provided with one or more the gaps 303, respectively. A specific schematic structural view corresponding to the embodiment is not provided in the present invention, and it should be easily understood by relevant technical personnel.

After formation of the gap 303 in the ring-shaped inorganic strip portions 2011, adjacent two of the first grooves 301 corresponding to the gap 303 spatially communicate, that is, the organic material filled in the two first grooves 301 are connected. In order to ensure best encapsulation performance, in certain embodiments, each of the outermost and innermost ring-shaped inorganic strip portions 2011 is annularly closed in shape, and the remaining ring-shaped inorganic strip portion is provided with a gap 303. Please refer to FIGS. 5 and 6 for schematic structural plan views of the first buffer area Z21.

Figure 5:
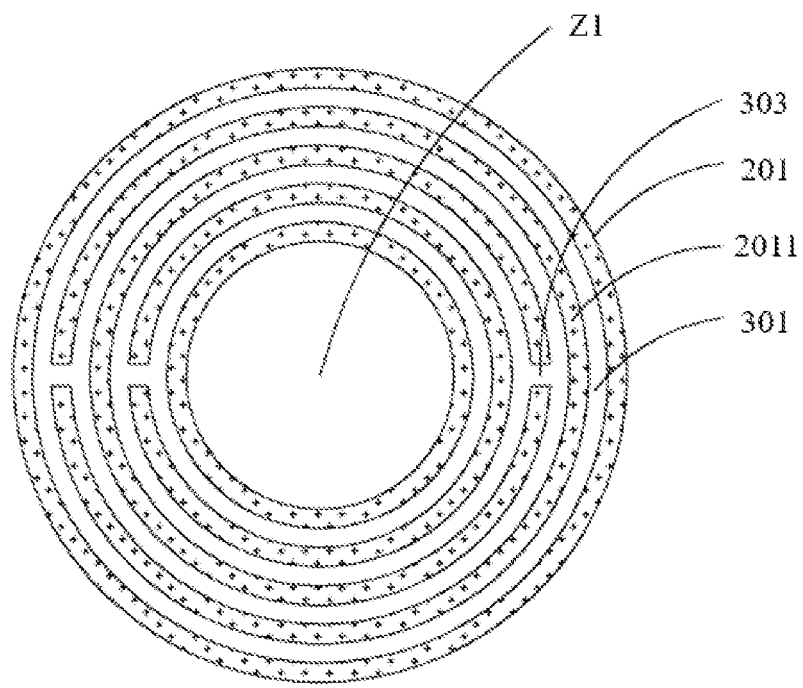
FIG. 5 is a schematic structural plan view of a first buffer area of an array substrate in accordance with another embodiment of the present invention.
Figure 6:
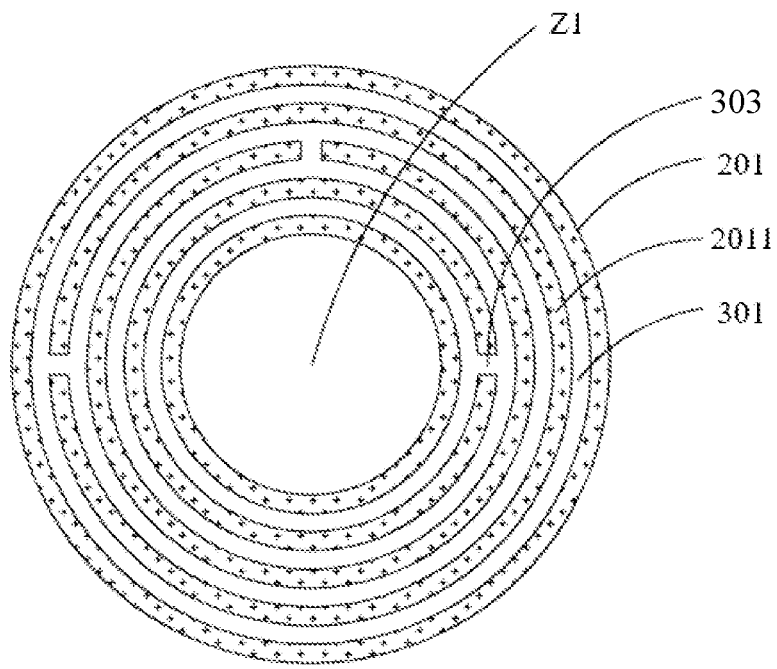
FIG. 6 is a schematic structural plan view of a first buffer area of an array substrate in accordance with another embodiment of the present invention.

Further, in order to extend a path where water vapor intrudes into an organic material as much as possible, the gaps 302 formed in adjacent two of the ring-shaped inorganic strip portions 2011 form an angle with respect to a center of the through hole area Z1, wherein the angle formed by the gaps 302 with respect to the center of the through hole area needs to be as large as possible. An optimum angle is 180 degrees, that is, a structure shown in FIG. 5 is formed. Practices have proved that a minimum angle can be 90 degrees, that is, a structure shown in FIG. 6 is formed. Accordingly, when each of adjacent two of the ring-shaped inorganic strip portions 2011 is provided with the gap 303, the two gaps 303 are located at an angle greater than or equal to 90 degrees and less than or equal to 180 degrees with respect to the center of the through hole area Z1.

Figure 7:
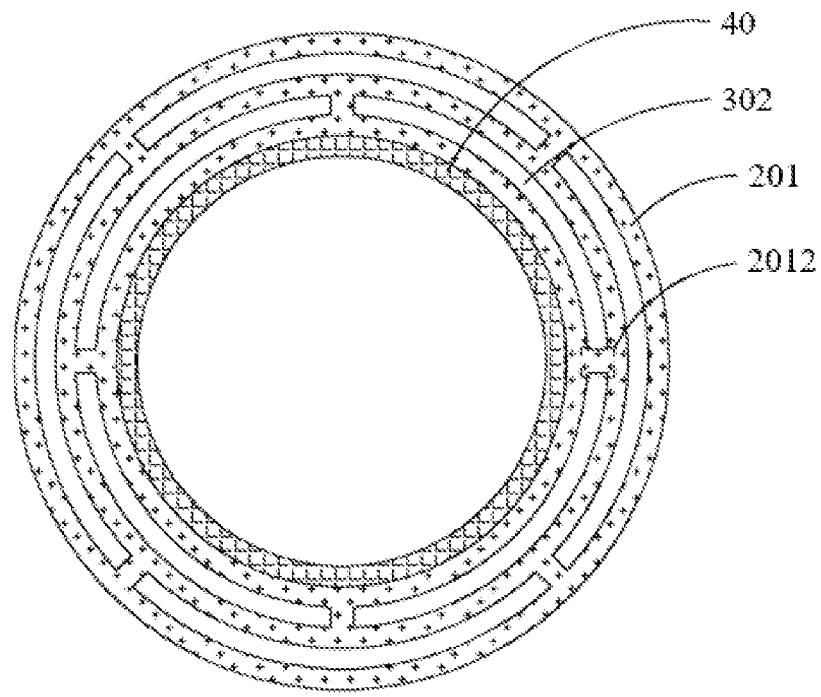
FIG. 7 is a schematic structural plan view of a second buffer area of an array substrate in accordance with an embodiment of the present invention.
Figure 8:
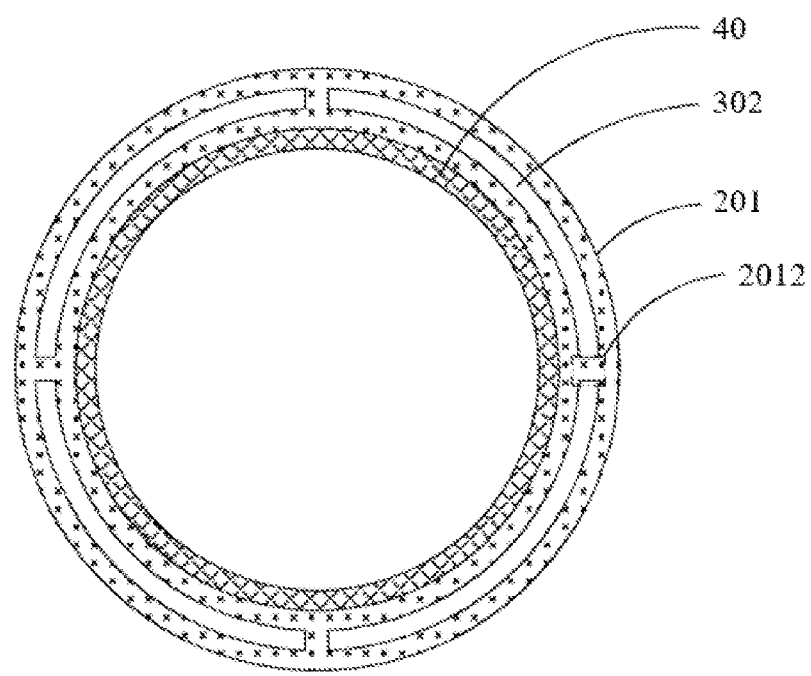
FIG. 8 is a schematic structural plan view of a second buffer area of an array substrate in accordance with another embodiment of the present invention.

In certain embodiments, please refer to FIGS. 7 and 8. At least one the second groove 302 is provided in the second buffer area Z22. Any one of the second grooves 302 has the non-closed ring shape and at least one interval portion 2012.

When one of the second grooves 302 is provided with a plurality of the interval portions 2012, the interval portions 2012 are evenly distributed in the one of the second grooves 302. On one hand, the second groove 302 and the first groove 301 both can achieve a purpose of reducing the stress on film layers, thereby to prevent cracks form being formed in the film layers. On the other hand, a difference from the first grooves 301 lies in that the second groove 302 is not filled with an organic material, that is, the second groove 302 is empty inside. In a subsequent thin-film encapsulation process, since the second groove 302 is low-lying, when a liquid organic material flows to a level extent during inkjet printing, the organic material will fill the second groove 302 first, so that a situation that the liquid organic material printed by inkjet printing flows over the block wall 40 can be effectively prevented.

Specifically, there are two second grooves 302 formed in the second buffer area Z22. Each of the second grooves 302 has a non-closed ring shape and is provided with four interval portions 2012 evenly distributed. The interval portions 2012 of two of the second grooves 302 are staggered with each other by 45 degrees, as a structure shown in FIG. 7.

Alternatively, the second buffer area Z22 is provided with one second groove 302. The second groove 302 has the non-closed ring shape and is provided with four interval portions 2012 evenly distributed, as a structure shown in FIG. 8. Certainly, other structures can be designed according to actual needs, but will not be stated here in the present invention.

The present invention further provides a method of manufacturing an array substrate, and please refer to FIGS. 9A-9D for specific steps. In this method, the array substrate includes a through hole area Z1, a buffer area Z2 provided around the through hole area Z1, and a display area Z3 provided around the buffer area Z2, wherein specific arrangement of the above-mentioned areas can be referred to in the foregoing embodiments, and will not be reiterated here.

Figure 9A:
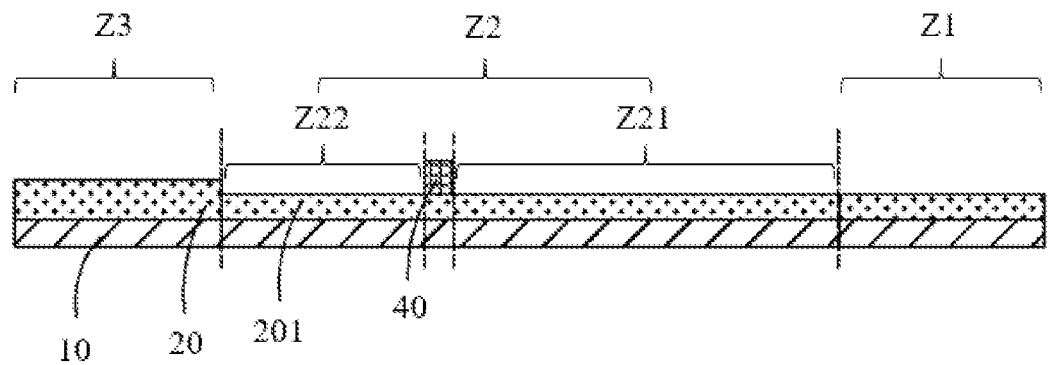
FIGS. 9A-9D are structural views schematically showing a process of manufacturing an array substrate in accordance with another embodiment of the present invention.

The method of manufacturing an array substrate includes steps as follows: S01: providing a substrate 10, forming an array functional layer 20 on the substrate 10, wherein the through area Z1 and the buffer area Z2 include film layers including only an inorganic film layer 201 disposed in the array functional layer 20 and a block wall 40 disposed on the inorganic film layer 201 in the buffer area Z2 and surrounding the through hole area Z1, so that a structure is shown in FIG. 9A.

Specifically, the block wall 40 is formed to divide the buffer area Z1 into a first buffer area Z21 defined between the block wall 40 and the though hole area Z1, and a second buffer area Z22 defined between the block wall 40 and the display area Z3.

It can be understood that the array functional layer in the display area Z3 generally includes various metal film layers, such as source and drain electrodes, gate electrodes, active layers, inorganic film layers, such as gate insulating layers, passivation layers, and interlayer dielectric layers, and organic film layers, such as planarization layers and pixel definition layers, etc. In the through hole area Z1, the array function layer in the buffer area Z2 only includes the inorganic film layers, and the block wall 40 formed synchronously with the organic film layers in the array function layer.

Figure 9B:
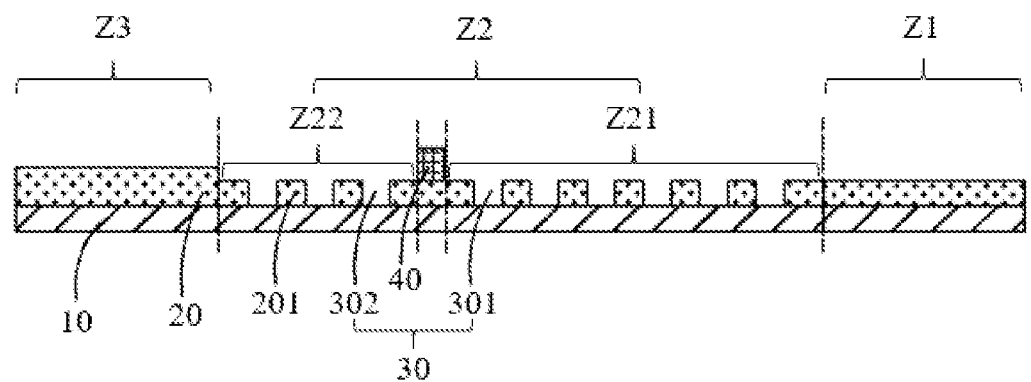

S02: forming at least one or more one groove 30 in the inorganic film layer around the through hole area. Generally, the groove 30 is formed by a dry etching process such that a structure shown in FIG. 9B is formed. The groove 30 so formed includes a first groove 301 formed in the first buffer area Z21, and/or a second groove 302 formed in the second buffer area Z22. The groove 30 has a closed ring shape or a non-closed ring shape, and please refer to the foregoing embodiments for detailed structures, which will not be repeated here. The groove has a depth less than a thickness of the inorganic film layer (not shown), or the groove is configured to expose the substrate 10.

Figure 9C:
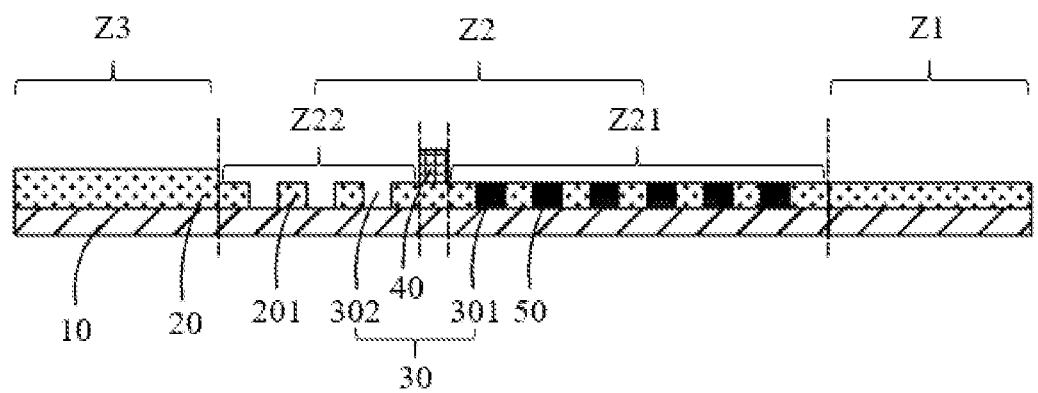
Figure 9D:
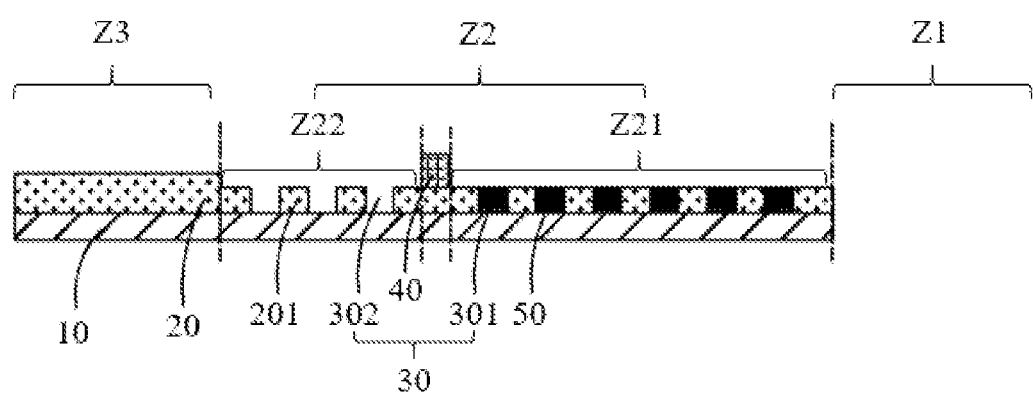

S03: filling an organic material 50 in the groove 30 so that a structure shown FIG. 9C is formed. A process of filling organic materials may be an inkjet printing process or a coating process. Generally, only the first groove 301 is filled with the organic material, while the second groove 302 remains empty inside. A process of fabricating a display panel is carried on after the array substrate. In a subsequent thin-film encapsulation process, since the second groove 302 is low-lying, when a liquid organic material flows to a level extent during inkjet printing, the organic material will fill the second groove 302 first, so that a situation that the liquid organic material printed by inkjet printing flows over the block wall 40 can be effectively prevented S04: forming a through hole to penetrate the through hole area Z1 by a cutting process. That is, the substrate and other film layers in the through hole area Z1 are removed, so that a structure shown in FIG. 9D is formed. A method used in the cutting process is generally a laser cutting process.

In another embodiment, the present invention further provides a display panel, including an array substrate, an OLED device layer disposed on the array substrate, and a thin-film encapsulation layer disposed on the OLED device layer, wherein the array substrate is selected from the array substrates provided in the above-mentioned embodiments.

In another embodiment, the present invention further provides a display device including the above-mentioned display panel. The display device includes, but is not limited to, mobile phones, tablets, computers, televisions, vehicle displays, smart watches, and virtual reality (VR) devices, and is not limited thereto.

In the above-mentioned embodiments, the description of each embodiment has its own emphasis. For a part that is not described in detail in an embodiment, please refer to the detailed description of other embodiments above, which will not be repeated here.

During specific implementation, each of the above units or structures can be implemented as independent entities, or in any combination, and implemented as the same or several entities. For the specific implementation of each of the above units or structures, please refer to the method in the above-mentioned embodiments, which will not be repeated here.

The above describes in detail an array substrate, a method of manufacturing the same, and a display panel provided by the embodiments of the present invention. Specific examples are used in this article to illustrate the principles and implementation of the present invention. The description of the above examples is only used to help understand the method and core ideas of the present invention. At the same time, for those skilled in the art, according to the idea of the present invention, there will be changes in the specific implementation and the scope of application. Accordingly, the content of this specification should not be construed as limitations to the present invention.

What is claimed is:

1. An array substrate, comprising:
   a substrate and an array functional layer disposed on the substrate;

wherein the array substrate is provided with a through hole area comprising a through hole, a buffer area provided around the through hole area, and a display area provided around the buffer area;

wherein the buffer area comprises part of the substrate and an inorganic film layer provided by the array functional layer disposed on the substrate;

wherein a groove is formed in the inorganic film layer around the through hole area, the groove has a closed ring shape or a non-closed ring shape, and the groove has a depth less than a thickness of the array functional layer, wherein a block wall is disposed on the inorganic film layer in the buffer area and surrounds the through hole area, a first buffer area is defined between the block wall and the though hole area, a second buffer area is defined between the block wall and the display area, and the groove comprises a first groove provided in the first buffer area, and/or a second groove provided in the second buffer area, wherein each of the first groove and the second groove has the closed ring shape or the non-closed ring shape, wherein the inorganic film layer comprises at least two ring-shaped inorganic strip portions defined and spaced apart by the first groove in the first buffer area, wherein when the first groove is annularly closed in shape, at least one of the at least two ring-shaped inorganic strip portions has one or more gaps, and an organic material is disposed in the one or more gaps.

2. The array substrate of claim 1, wherein an organic material is disposed in the first groove.

3. The array substrate of claim 1, wherein the groove comprises at least two first grooves in the first buffer area, and the inorganic film layer comprises at least three ring-shaped inorganic strip portions defined and spaced apart by the at least two first grooves in the first buffer area, wherein each of the outermost and innermost ring-shaped inorganic strip portions is annularly closed in shape, and the remaining ring-shaped inorganic strip portion has a gap.

4. The array substrate of claim 1, wherein a pair of adjacent ring-shaped inorganic strip portions of the at least two of the ring-shaped inorganic strip portions are provided with the gaps located at an angle greater than or equal to 90 degrees and less than or equal to 180 degrees with respect to a center of the through hole area.

5. The array substrate of claim 1, wherein the second groove has the non-closed ring shape and one or more interval portions.

6. The array substrate of claim 5, wherein the second groove comprises a first second-groove and a second second-groove in the second buffer area, and each of the first second-groove and the second second-groove has the non-closed ring shape and is provided with four interval portions evenly distributed, and wherein the interval portions of the first second-groove and the second second-groove are staggered with respect to each other by 45 degrees.

7. The array substrate of claim 5, wherein the groove comprises one second groove provide in the second buffer area, and, the second groove has the non-closed ring shape and is provided with four interval portions evenly distributed.

8. A display panel, comprising the array substrate of claim 1.

* * * * *